(12) United States Patent
Otremba et al.

(10) Patent No.: US 8,916,474 B2
(45) Date of Patent: Dec. 23, 2014

(54) SEMICONDUCTOR MODULES AND METHODS OF FORMATION THEREOF

(71) Applicant: Infineon Technologies AG, Neubiberg (DE)

(72) Inventors: Ralf Otremba, Kaufbeuren (DE); Josef H•glauer, Heimstetten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/769,769

(22) Filed: Feb. 18, 2013

(65) Prior Publication Data

US 2014/0232015 A1    Aug. 21, 2014

(51) Int. Cl.
H01L 21/311 (2006.01)
H01L 23/28 (2006.01)
H01L 21/56 (2006.01)

(52) U.S. Cl.
CPC .............. *H01L 23/28* (2013.01); *H01L 21/56* (2013.01)
USPC ........... 438/700; 438/106; 438/112; 438/124; 257/E21.006; 257/E21.007; 257/E21.055; 257/E21.077; 257/E21.082; 257/E21.267; 257/E21.499; 257/E21.324; 257/E21.503; 257/E21.577; 257/E21.585

(58) Field of Classification Search
USPC ......... 438/700, 270, 106, 107, 112, 124, 311, 438/611, 931; 257/E21.006, E21.007, 257/E21.055, E21.077, E21.082, E21.267, 257/E21.324, E21.499, E21.503, E21.577, 257/E21.585
See application file for complete search history.

(56) References Cited

U.S. PATENT DOCUMENTS

| | | | |
|---|---|---|---|
| 6,750,545 B1 * | 6/2004 | Lee et al. | 257/777 |
| 7,473,582 B2 * | 1/2009 | Wood et al. | 438/113 |
| 7,728,415 B2 | 6/2010 | Hosseini et al. | |
| 7,800,217 B2 | 9/2010 | Otremba et al. | |
| 7,923,295 B2 * | 4/2011 | Shim et al. | 438/109 |
| 7,947,532 B2 | 5/2011 | Otremba et al. | |
| 7,969,018 B2 | 6/2011 | Otremba et al. | |
| 7,982,297 B1 * | 7/2011 | Heo | 257/686 |
| 7,993,972 B2 * | 8/2011 | Lin et al. | 438/109 |
| 8,722,457 B2 * | 5/2014 | Camacho et al. | 438/107 |
| 2008/0017907 A1 | 1/2008 | Otremba | |
| 2011/0215460 A1 | 9/2011 | Otremba et al. | |
| 2014/0001615 A1 | 1/2014 | Otremba et al. | |

FOREIGN PATENT DOCUMENTS

DE    102005027356 A1    12/2006
DE    102006021959 A1    11/2007

OTHER PUBLICATIONS

"PGA Package," PGA (pin grid array) Webpage, ITWissen.info, <http://www.itwissen.info/definition/lexikon/pin-grid-array-PGA-PGA-Pacakge.html>, retrieved Jun. 26, 2012, 1 page.
Wojnowski, M., et al.., "Package Trends for Today's and Future mm-Wave Applications," 38th European Microwave Conference 2008, Amsterdam, Oct. 28-31, 2008, 55 pages.

* cited by examiner

*Primary Examiner* — David Nhu
(74) *Attorney, Agent, or Firm* — Slater & Matsil, L.L.P.

(57) ABSTRACT

In accordance with an embodiment of the present invention, a semiconductor module includes a first semiconductor package having a first semiconductor die, which is disposed in a first encapsulant. An opening is disposed in the first encapsulant. A second semiconductor package including a second semiconductor die is disposed in a second encapsulant. The second semiconductor package is disposed at least partially within the opening in the first encapsulant.

31 Claims, 9 Drawing Sheets

SEMICONDUCTOR MODULES AND METHODS OF FORMATION THEREOF

TECHNICAL FIELD

The present invention relates generally to semiconductor devices, and more particularly to semiconductor modules and methods of formation thereof.

BACKGROUND

Semiconductor devices are used in many electronic and other applications. Semiconductor devices comprise integrated circuits or discrete devices that are formed on semiconductor wafers by depositing many types of thin films of material over the semiconductor wafers, and patterning the thin films of material to form the integrated circuits.

The semiconductor devices are typically packaged within a ceramic or a plastic body to protect from physical damage and corrosion. The packaging also supports the electrical contacts required to connect to the devices. Many different types of packaging are available depending on the type and the intended use of the die being packaged. Typical packaging, e.g., dimensions of the package, pin count, may comply with open standards such as from Joint Electron Devices Engineering Council (JEDEC). Packaging may also be referred as semiconductor device assembly or simply assembly.

Packaging may be a cost intensive process because of the complexity of connecting multiple electrical connections to external pads while protecting these electrical connections and the underlying chips.

Packaged devices are mounted on a printed circuit board or other equivalent component for connecting with other components. In many applications, space on a printed circuit board or within a final device (e.g., a hand held device) is limited. Therefore, in some designs, the packages are stacked over each other. However, vertical stacking may not be sufficient when the components have to be packed within a limited space. Alternatively, vertically stacked dies within a single package are expensive due to the more complex packaging process and have to be predesigned and therefore provide no flexibility to the consumer.

SUMMARY OF THE INVENTION

In accordance with an embodiment of the present invention, a semiconductor module comprises a first semiconductor package comprising a first semiconductor die disposed in a first encapsulant, an opening in the first encapsulant, and a second semiconductor package comprising a second semiconductor die disposed in a second encapsulant. The second semiconductor package is disposed at least partially within the opening in the first encapsulant.

In accordance with an embodiment of the present invention, a semiconductor package comprises a first semiconductor die disposed in a first encapsulant, an opening in the first encapsulant, and a second semiconductor die disposed at least partially within the opening in the first encapsulant.

In accordance with an embodiment of the present invention, a method of forming a semiconductor module comprises providing a semiconductor package comprising a semiconductor die disposed in a first encapsulant, and forming an opening in the first encapsulant of the semiconductor package to expose a plurality of contact metallization of the semiconductor die. Contact pads are then formed over the plurality of contact metallization. The semiconductor component is placed within the opening and attached to the contact pads.

In accordance with an embodiment of the present invention, a method of forming a semiconductor module comprises providing a semiconductor package comprising a plurality of leads, a first semiconductor die supported by a die paddle and disposed in a first encapsulant, and a clip coupling a region to a lead of the plurality of leads of the semiconductor package. An opening is formed in the first encapsulant of the semiconductor package to expose a portion of a top surface of the clip. A semiconductor component is placed within the opening. The semiconductor component is attached to the exposed portion of the top surface of the clip.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1B, illustrates a semiconductor module in accordance with embodiments of the invention, wherein FIG. 1A illustrates a cross-sectional view while FIG. 1B illustrates a top view;

FIG. 2, which includes FIGS. 2A-2B, illustrates a semiconductor module in accordance with embodiments of the invention, wherein FIG. 2A illustrates a cross-sectional view while FIG. 2B illustrates a top view;

FIG. 3, which includes FIGS. 3A-3C, illustrates a semiconductor module in accordance with embodiments of the invention, wherein FIGS. 3A and 3B illustrate cross-sectional views while FIG. 3C illustrates a top view;

FIG. 9, which includes 9A-9C, illustrates a semiconductor package during fabrication after attaching interconnects in accordance with an embodiment of the present invention, wherein FIGS. 9A and 9B illustrate different types of clips while

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of the present invention will be described using FIG. 1. Further alternative structural embodiments will be described using FIGS. 2-5. A method of assembling the semiconductor module will be described using FIGS. 8-14. Alternative embodiments of assembling the semiconductor module will be described using FIGS. 15-17.

Figure 1A:
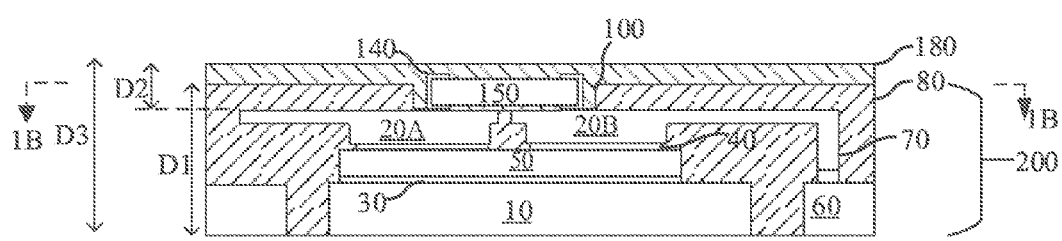
Figure 1B:
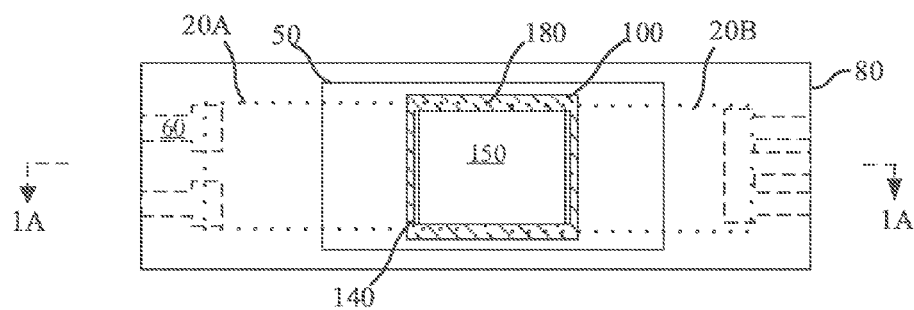

FIG. 1, which includes FIGS. 1A-1B, illustrates a semiconductor module in accordance with embodiments of the invention, wherein FIG. 1A illustrates a cross-sectional view while FIG. 1B illustrates a top view.

In various embodiments, the semiconductor module comprises a base semiconductor package 200 and a semiconductor component 150 over the semiconductor package 200. Although, in various embodiments, a single semiconductor component 150 is illustrated, embodiments of the present invention include more than one semiconductor component stacked over the semiconductor package 200. Further in some embodiments, one or more semiconductor components may be stacked over the semiconductor component 150.

Referring to FIG. 1A, the semiconductor package comprises at least one die 50 embedded within a first encapsulating material 80. The die 50 is disposed over a lead frame 10, which has a plurality of leads 60 for contacting the semiconductor package. The die 50 is attached to the leadframe 10 using a first adhesive layer 30, which may be any suitable material that fixes the die 50 to the leadframe 10. The first adhesive layer 30 may be a conductive adhesive allowing contact to the back side of the die 50. For example, the back side of the die 50 may include a contact pad for coupling the die 50. The die 50 may also have one or more contact pads on the front side. The die contact pads may comprise a conductive material and may comprise gold, tin, copper, aluminum, silver, nickel, platinum, and combinations thereof. In other embodiments, the semiconductor package may comprise any type of package such as a chip scale package including wafer level process package or embedded wafer level process package, ball grid array package, thin outline package, transistor outline package, and others. In one embodiment, the semiconductor package is a thin short outline package.

In various embodiments, the die 50 may be coupled to the plurality of leads 60 by various types of interconnects. For example, in one embodiment, a first clip 20A and a second clip 20B may be disposed over a first contact area and a second contact area of the die 50 and embedded within the first encapsulating material 80. In alternative embodiments, the die 50 may be coupled using other types of interconnects such as bond wires, leads, strips, and other suitable way to connect.

The first and the second clips 20A and 20B may be attached to the die 50 using a second adhesive layer 40, which may comprise a conductive layer. In one or more embodiments, the first adhesive layer 30 and the second adhesive layer 40 may comprise a polymer such as a cyanide ester or epoxy material and may comprise silver particles. In one embodiment, the first adhesive layer 30 and the second adhesive layer 40 may comprise a composite material comprising conductive particles in a polymer matrix. In an alternative embodiment, the first adhesive layer 30 and the second adhesive layer 40 may comprise a conductive nano-paste. Alternatively, in another embodiment, the first adhesive layer 30 and the second adhesive layer 40 comprise a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the first adhesive layer 30 and the second adhesive layer 40.

As illustrated in FIG. 1A, an opening 100 is disposed in the first encapsulating material 80 above the die 50. The opening 100 may expose one or more contact pads of the die 50 in one embodiment. Alternatively, the opening 100 may expose a metallization layer over the die 50. In one embodiment, the opening 100 expose a portion of the first and the second clips 20A and 20B.

A semiconductor component 150 is disposed over the first and the second clips 20A and 20B within the opening 100. In various embodiments, the semiconductor component 150 may be completely disposed within the opening 100. Alternatively, in some embodiments, the semiconductor component 150 may protrude out of the opening 100.

In various embodiments, the semiconductor component 150 may be a single die package or may comprise multiple dies. In alternative embodiments, the semiconductor component 150 may comprise a semiconductor die prior to packaging. In some embodiments, the semiconductor component 150 may comprise a chip scale package, for example, produced using wafer level processing. In other embodiments, the semiconductor component 150 may comprise other types of packages such as a ball grid array package, thin short outline package, transistor outline package, and others.

In some embodiments, the semiconductor component 150 may comprise a passive device such as an inductor, a resistor, and/or a capacitor. In one embodiment, the semiconductor component 150 comprises a discrete passive device, for example, a discrete inductor, a discrete resistor, or a discrete capacitor.

As illustrated in FIG. 1A, the semiconductor component 150 may include a component pad 140 for contacting and coupling the semiconductor component 150 with the underlying first and second clips 20A and 20B. In one embodiment, the component pad 140 may be coupled directly to the first and the second clips 20A and 20B. In an alternative embodiment, the component pad 140 may be attached to the first and the second clips 20A and 20B using an adhesive layer, for example, a solder material, a conductive paste, and others.

In one or more embodiments, a second encapsulating material 180 may be disposed over the semiconductor component 150. The second encapsulating material 180 may partially or completely fill the opening 100. In one embodiment, the first encapsulating material 80 and the second encapsulating material 180 may comprise the same material. However, in some embodiments, the first encapsulating material 80 may be different from the second encapsulating material 180. In particular, the second encapsulating material 180 may have to be formed (deposited and cured) at a lower temperature than the first encapsulating material 80. Further, the second encapsulating material 180 may need to flow into the cavity between the semiconductor component 150 and the sidewalls of the opening 100. Therefore, the second encapsulating material 180 may be designed to flow better than the first encapsulating material 80.

As illustrated in FIG. 1A, the first encapsulating material 80 (or the base semiconductor package 200) has a first thickness D1, which is the thickness of the base semiconductor package. The semiconductor component 150 has a second thickness D2, which is smaller than the first thickness D1. However, the combined package comprising the base semiconductor package and the semiconductor component 150 has a third thickness D3, which is smaller than the sum of the first thickness D1 and the second thickness D2.

A top sectional view of the semiconductor package is illustrated in FIG. 1B. As illustrated in FIG. 1B, the first and the second clips 20A and 20B extend from over the die 50 to the plurality of leads 60. The semiconductor component 150 is disposed over the first and the second clips 20A and 20B within the opening 100.

Thus, in various embodiments, the semiconductor component uses the leads of the base semiconductor package to contact with external components.

Figure 2A:
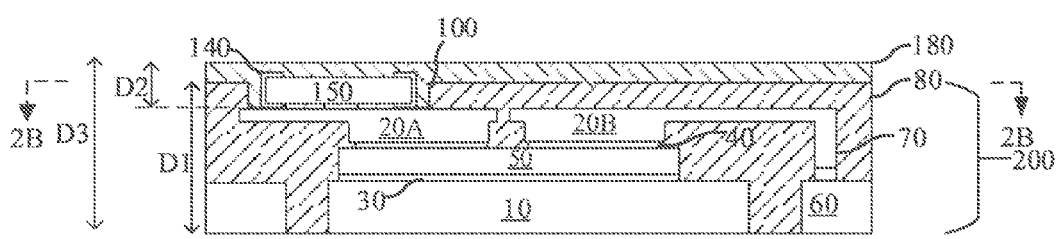
Figure 2B:
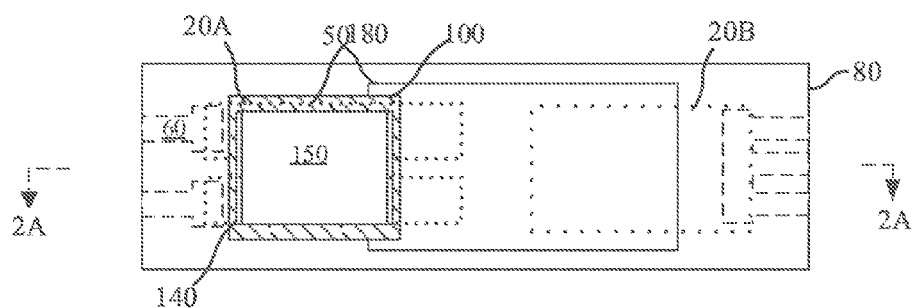

FIG. 2, which includes FIGS. 2A-2B, illustrates a semiconductor module in accordance with embodiments of the invention, wherein FIG. 2A illustrates a cross-sectional view while FIG. 2B illustrates a top view.

In various embodiments, the semiconductor component 150 may be placed anywhere over the semiconductor package. For example, in one embodiment illustrated in FIG. 2, the semiconductor component 150 is placed on one side of the semiconductor package over a plurality of clips.

Figure 3A:
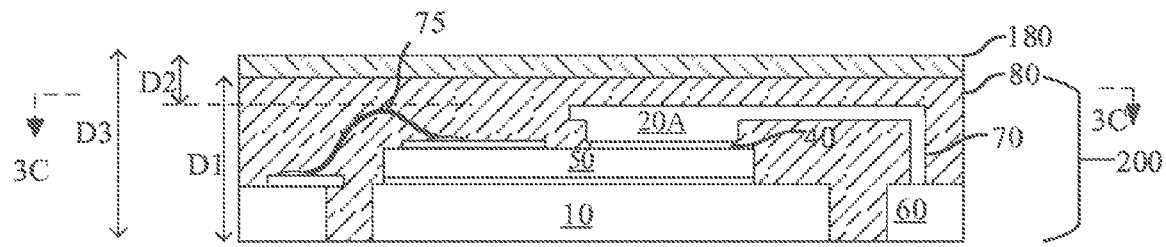
Figure 3B:
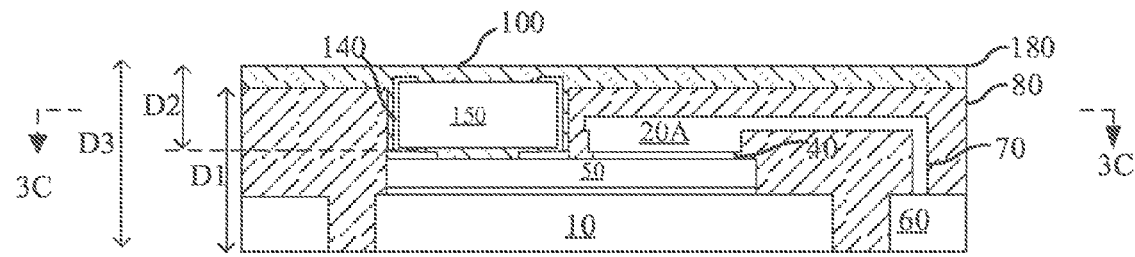
Figure 3C:
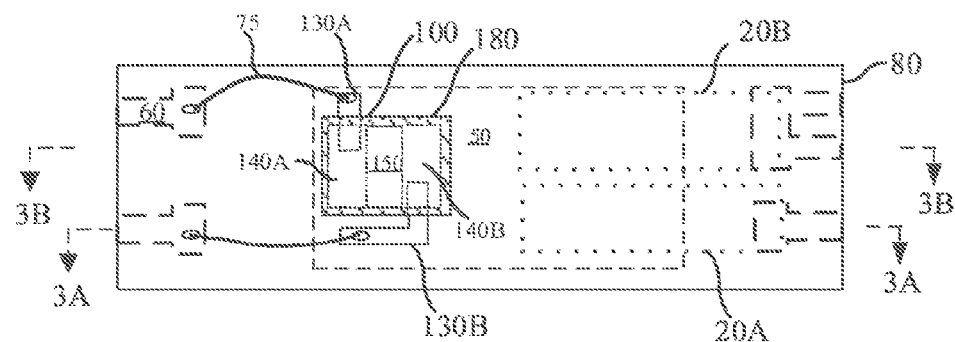

FIG. 3, which includes FIGS. 3A-3C, illustrates a semiconductor module in accordance with embodiments of the invention, wherein FIGS. 3A and 3B illustrate cross-sectional views while FIG. 3C illustrates a top view.

In alternative embodiments, the semiconductor component 150 may be placed directly over contact pads of the die 50. As illustrated in FIG. 3A, the base semiconductor package 200 may comprise a die 50 having a plurality of contact areas on a first major surface. The second major surface of the die 50 may be coupled to a die paddle 10 of a lead frame using an adhesive layer 30 as described in prior embodiments.

In various embodiments, the die 50 may be coupled to a plurality of leads 60. In one embodiment, the semiconductor component 150 may be coupled to redistribution leads 130, which may be coupled to the die 50 in some embodiments. Alternatively, one or more of the redistribution leads 130 may be electrically isolated from the die 50. For example, a contact pad of the semiconductor component 150 may be coupled to a lead of the plurality of leads 60 without being coupled to the die 50.

In one embodiment, the semiconductor component 150 may protrude out of the first encapsulating material 80. In other embodiments, the semiconductor component 150 may be fully disposed within the base semiconductor package 200.

In one or more embodiments, a second encapsulating material 180 may be coated over the base semiconductor package 200 or the first encapsulating material 80. The second encapsulating material 180 may partially or completely fill the opening 100 within the first encapsulating material 80.

FIG. 3C illustrates a top view of the semiconductor module in accordance with an embodiment of the invention. As illustrated in FIG. 3C, the die 50 may be coupled to a plurality of leads 60 using various types of interconnects. For example, FIG. 3C shows that the first clip 20A and the second clip 20B are coupled to different leads of the plurality of leads 60. Further, the semiconductor component 150 is coupled to a first redistribution lead 130A and a second redistribution lead 130B. The redistribution leads may have different shapes in various embodiments. For example, in one embodiment, an L-shaped redistribution lead is illustrated as the second redistribution lead 130B. As further illustrated in FIG. 3C, the first redistribution lead 130A is coupled to a first contact pad 140A while the second redistribution lead 130B is coupled to a second contact pad 140B. The first and the second contact pads 140A and 140B may be part of the semiconductor component 150.

In various embodiments, one or more contact pads on the die 50 may be coupled to the plurality of leads 60 using bond wires 75. In one embodiment, the die 50 may be a power die configured to operate at a higher voltage, for example, above 20V. In one embodiment, the gate region of a power die may be coupled using bond wires 75 while a source region of the power die may be coupled using a clip type interconnect. Embodiments of the present invention include a combination of the embodiments described in FIGS. 2 and 3. For example, in one embodiment, a first component may be stacked over the contact metallization of the base semiconductor package as in FIG. 3 while a second component may be stacked over the clip as in FIG. 2.

Figure 4:
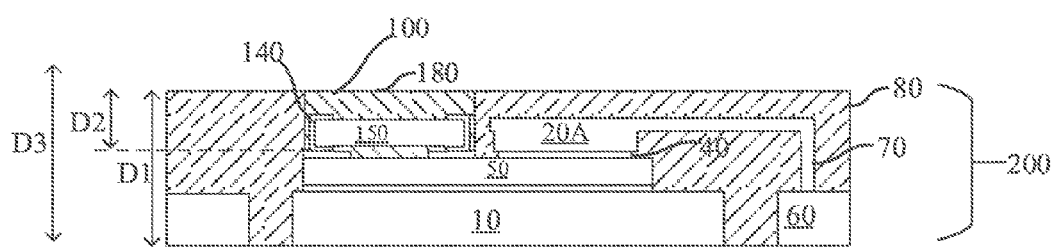
FIG. 4 illustrates an alternative embodiment of a cross-sectional view of a semiconductor module.

FIG. 4 illustrates an alternative embodiment of a cross-sectional view of a semiconductor module.

Referring to FIG. 4, the semiconductor component 150 is fully disposed within the opening 100 of the first encapsulating material 80. As illustrated, the second thickness D2 may be less than the height of the opening 100. In such an embodiment, the first thickness D1 of the base semiconductor package 200 is about the same as the third thickness D3 of the semiconductor module.

Figure 5:
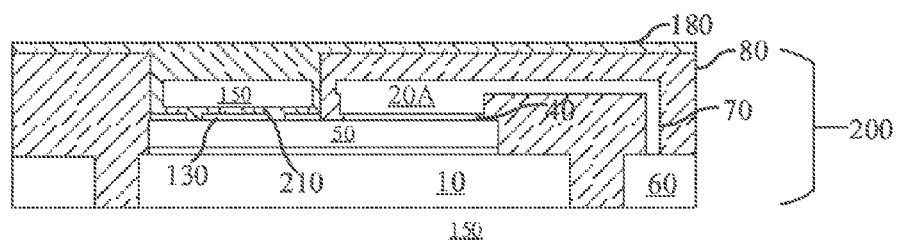
FIG. 5 illustrates a cross-sectional view of a semiconductor module having an overflow layer in accordance with an alternative embodiment of the present invention.

FIG. 5 illustrates a semiconductor module having an overflow layer in accordance with an alternative embodiment of the present invention.

In one or more embodiments, the second encapsulating material 180 may have an overflow section covering the top major surface of the first encapsulating material 80. The overflow layer may help to prevent delamination of the second encapsulating material 180 around the corners of the opening 100.

Figure 6:
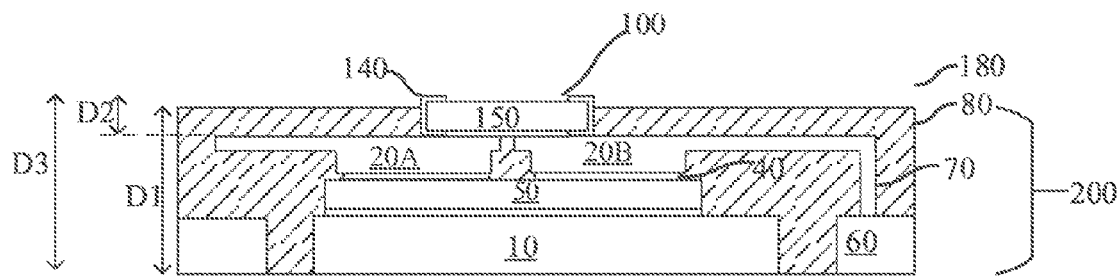
FIG. 6 illustrates a semiconductor module having a protruding semiconductor component in accordance with an alternative embodiment of the present invention.

FIG. 6 illustrates a semiconductor module having a protruding semiconductor component in accordance with an alternative embodiment of the present invention.

In one or more embodiments, the semiconductor component 150 may be bonded to the clips of the base semiconductor package 200. In some embodiments, the height of the opening 100 may be less than a height of the semiconductor component (second depth D2). In such embodiments, the semiconductor component 150 may protrude out. Further, as illustrated, in some embodiments, no additional encapsulating material or protective material may be necessary. The semiconductor component 150 may be directly bonded after which there is no further processing in one embodiment. This may be useful to minimize processing costs and may be performed at a low cost facility.

Figure 7:
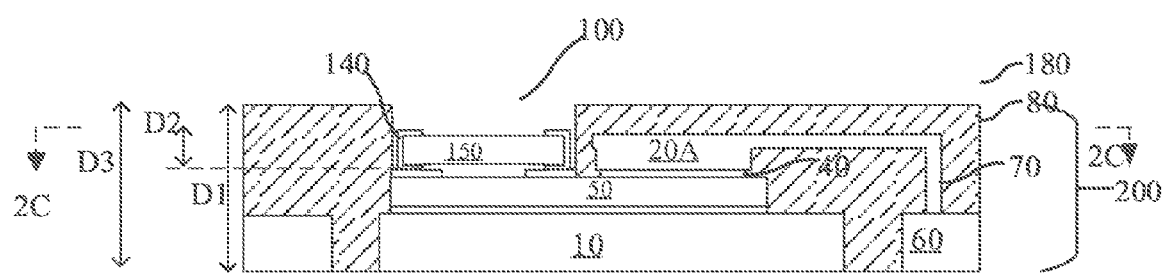
FIG. 7 illustrates a semiconductor module having a semiconductor component directly bonded to a base semiconductor package without additional protective layers in accordance with an alternative embodiment of the present invention.

FIG. 7 illustrates a semiconductor module having a semiconductor component directly bonded to a base semiconductor package 200 without additional protective layers in accordance with an alternative embodiment of the present invention.

In a further embodiment, the semiconductor component 150 is bonded to a bond pad or contact pad of the base semiconductor package 200. As in the embodiment of FIG. 6, there are no additional protective layers over the base semiconductor package 200. Thus, there remains a gap between the sidewalls of the opening 100 and the semiconductor component 150. In the illustrated embodiment, the semiconductor component 150 is fully disposed within the opening 100. Again this embodiment may be practiced in a low cost facility because it requires minimal processing steps.

FIGS. 8-14 illustrates various stages of fabrication of the semiconductor module in accordance with embodiments of the invention.

Figure 8:
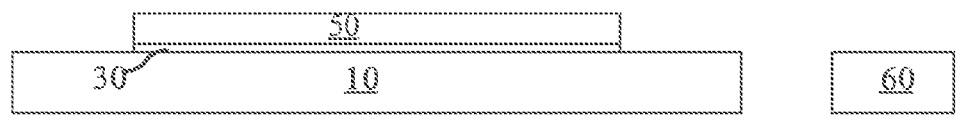
FIG. 8 illustrates a die attached to a lead frame during fabrication of a base semiconductor module in accordance with an embodiment of the present invention.

FIG. 8 illustrates a die attached to a lead frame during fabrication of a base semiconductor package in accordance with an embodiment of the present invention.

In various embodiments, the base semiconductor package 200 may be any type of package. In one embodiment, the base semiconductor package 200 is a lead frame package. FIGS. 8-10 illustrate a fabrication of a lead frame package in accordance with one embodiment. However, if the base semiconductor package is different, a person having ordinary skill in the art may modify the fabrication of the base semiconductor package accordingly.

Using conventional processing, for example, a wafer may be diced to form a plurality of dies 50. The die 50 may be formed on a silicon substrate such as a bulk silicon substrate or a silicon on insulator (SOI) substrate. Alternatively, the die 50 may be a device formed on silicon carbide (SiC). Embodiments of the invention may also include devices formed on compound semiconductor substrates and may include devices on hetero-epitaxial substrates. In one embodiment, the die 50 is a device formed at least partially on gallium nitride (GaN), which may be a GaN on sapphire or silicon substrate.

In various embodiments, the die 50 may comprise a power chip, which, for example, draw large currents (e.g., greater than 30 amperes). In various embodiments, the die 50 may comprise a discrete vertical device such as a two or a three terminal power device. Examples of the die 50 include PIN or Schottky diodes, MISFET, JFET, BJT, IGBT, or thyristor.

In various embodiments, the die 50 may be a vertical semiconductor device configured to operate at about 20 V to about 1000 V. In one embodiment, the die 50 may be configured to operate at about 20 V to about 100 V. In another embodiment, the die 50 may be configured to operate at about 100 V to about 500 V. In yet another embodiment, the die 50 may be configured to operate at about 500 V to about 1000 V. In one embodiment, the die 50 may be an NPN transistor. In another embodiment, the die 50 may be a PNP transistor. In yet another embodiment, the die 50 may be an n-channel MISFET. In a further embodiment, the die 50 may be a p-channel MISFET. In one or more embodiments, the die 50 may comprise a plurality of devices such as a vertical MISFET and a diode, or alternatively two MISFET devices separated by an isolation region.

The thickness of the die 50 from the top surface to the opposite bottom surface may be less than 50 μm in various embodiments. The thickness of the die 50 from the top surface to the bottom surface may be less than 20 μm in one or more embodiments. In some embodiments, to improve heat dissipation, the thickness of the die 50 from the top surface to the bottom surface may be less than 10 μm in one or more embodiments.

Referring to FIG. 8, the die 50 is placed over a lead frame 10. The die 50 may be attached to the lead frame 10 using a first adhesive layer 30, which may be insulating in one embodiment. In some embodiments, the first adhesive layer 30 may be conductive, for example, may comprise a nano-conductive paste. In alternative embodiments, the first adhesive layer 30 is a solderable material.

In one embodiment, the first adhesive layer 30 comprises a polymer such as a cyanide ester or epoxy material and may comprise silver particles. In one embodiment, the first adhesive layer 30 may be applied as conductive particles in a polymer matrix so as to form a composite material after curing. In an alternative embodiment, a conductive nano-paste such as a silver nano-paste may be applied. Alternatively, in another embodiment, the first adhesive layer 30 comprises a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the die attach layer 280.

The first adhesive layer 30 may be dispensed in controlled quantities under the die 50. A first adhesive layer 30 having a polymer may be cured at about 125° C. to about 200° C. while a solder based first adhesive layer 30 may be cured at 250° C. to about 350° C. Using the first adhesive layer 30, the die 50 is attached to the die paddle of the leadframe 10.

Figure 9A:
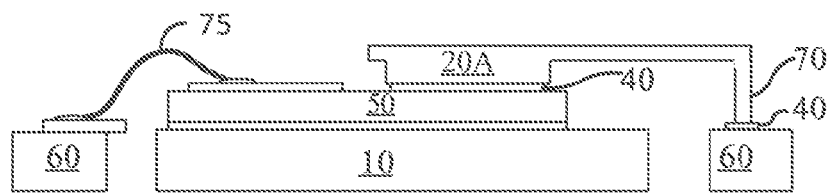
Figure 10:
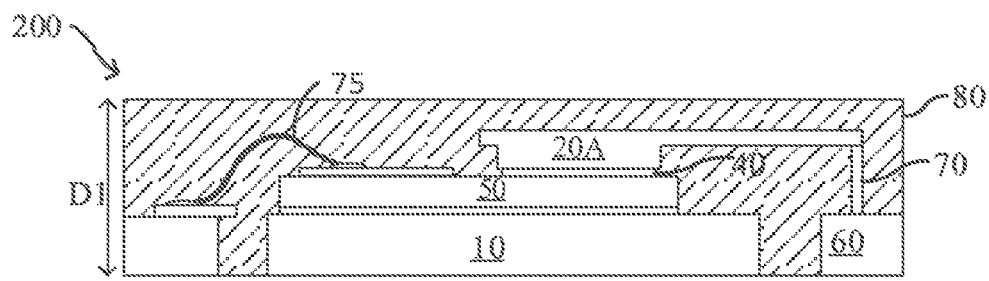
FIG. 10 illustrates a semiconductor package during fabrication after forming a protective encapsulant layer around the die in accordance with an embodiment of the present invention.
Figure 9B:
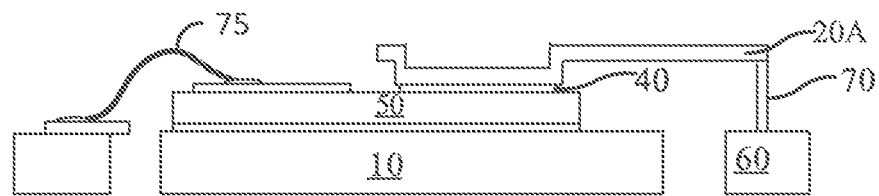
Figure 9C:
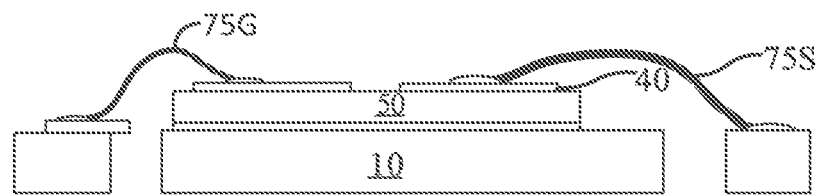
FIG. 9C illustrates bond wires as interconnects.

FIG. 9, which includes 9A-9C, illustrates a semiconductor module during fabrication after attaching interconnects in accordance with an embodiment of the present invention. FIGS. 9A and 9B illustrate different types of clips while FIG. 9C illustrates bond wires as interconnects.

Referring to FIG. 9A, in one embodiment, a plurality of clips such as a first clip 20A is attached to a pad on the die 50. Other clips (not illustrated) may be attached at the same time, for example, may be in another cross-sectional plane. A second adhesive layer 40 may be formed over the die 50 and the first clip 20A may be attached to the die 50 using the second adhesive layer 40. Using the second adhesive layer 40, the die 50 is attached to a first clip 20A. Referring to FIG. 9A, the other end of the first clip 20A may be attached to a lead of the plurality of leads 60 using another portion of the second adhesive layer 40. In various embodiments, the second adhesive layer 40 may be formed similar to the first adhesive layer 30.

In one or more embodiments, the second adhesive layer 40 may be an electrically conductive adhesive layer. In other embodiments, the second adhesive layer 40 may be a soft solder or a nano die attach. In one embodiment, the second adhesive layer 40 comprises a polymer such as a cyanide ester or epoxy material and may comprise silver particles. In one embodiment, the second adhesive layer 40 may be applied as conductive particles in a polymer matrix so as to form a composite material after curing. In an alternative embodiment, a conductive nano-paste such as a silver nano-paste may be applied. Alternatively, in another embodiment, the second adhesive layer 40 comprises a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the second adhesive layer 40. The second adhesive layer 40 having a polymer may be cured at about 125° C. to about 200° C. while solder based second adhesive layer 40 may be cured at 250° C. to about 350° C.

In one or more embodiments, other contact pads on the die 50 are coupled to the lead frame 10 using bond wires 75 using a wire bonding process (FIG. 9A). The bond wires 75 may be soldered to the leads 60 of the leadframe 10 and the contact pads using solder balls. In one or more embodiments, high-speed wire bond equipment may be used to minimize the time of forming the wire bonds. Image recognition systems may be used to orient the die 50 during the wire bonding process in some embodiments.

FIG. 9B illustrates an alternative embodiment of an interconnect in which the clip is stamped, molded, or bent to form a contact with the die 50. FIG. 9C illustrates a further alternative embodiment of using wire bonds. Some of the wire bonds may be thicker to support a higher current. For example, the source wire bond 75S to the source contact pad of the die 50 may be thicker than the gate wire bond 75G to the gate contact pad.

FIG. 10 illustrates a semiconductor module during fabrication after forming a protective encapsulant layer around the die in accordance with an embodiment of the present invention.

Referring to FIG. 10, a first encapsulating material 80 is deposited over the plurality of clips comprising the first clip 20A, the die 50, and the lead frame 10. In various embodiments, the first encapsulating material 80 is coated over the entire first clip 20A, the die 50, and the lead frame 10. The die 50 is thus embedded within the first encapsulating material 80. In one embodiment, the first encapsulating material 80 is applied using a compression molding process. In compression molding, the first encapsulating material 80 may be placed into a molding cavity, then the molding cavity is closed to compress the first encapsulating material 80. Compression molding may be used when a single pattern is being molded. In an alternative embodiment, the first encapsulating material 80 is applied using a transfer molding process, for example, in a batch process and individual packages may be formed by singulation after a curing process.

In other embodiments, the first encapsulating material 80 may be applied using injection molding, granulate molding, powder molding, or liquid molding. Alternatively, the first encapsulating material 80 may be applied using printing processes such as stencil or screen printing.

In various embodiments, the first encapsulating material 80 comprises a dielectric material and may comprise a mold compound in one embodiment. In other embodiments, the first encapsulating material 80 may comprise a polymer, a biopolymer, a fiber impregnated polymer (e.g., carbon or glass fibers in a resin), a particle filled polymer, and other organic materials. In one or more embodiments, the first encapsulating material 80 comprises a sealant not formed using a mold compound, and materials such as epoxy resins and/or silicones. In various embodiments, the first encapsulating material 80 may be made of any appropriate duroplastic, thermoplastic, or thermosetting material, or a laminate. The material of the first encapsulating material 80 may include filler materials in some embodiments. In one embodiment, the first encapsulating material 80 may comprise epoxy material and a fill material comprising small particles of glass or other electrically insulating mineral filler materials like alumina or organic fill materials.

The first encapsulating material 80 may be cured, i.e., subjected to a thermal process to harden thus forming a hermetic seal protecting the die 50, the first and the second adhesive layers 30 and 40, the first clip 20A, and the lead frame 10. Thus a base semiconductor package 200 is formed in accordance with an embodiment of the invention.

Figure 11:
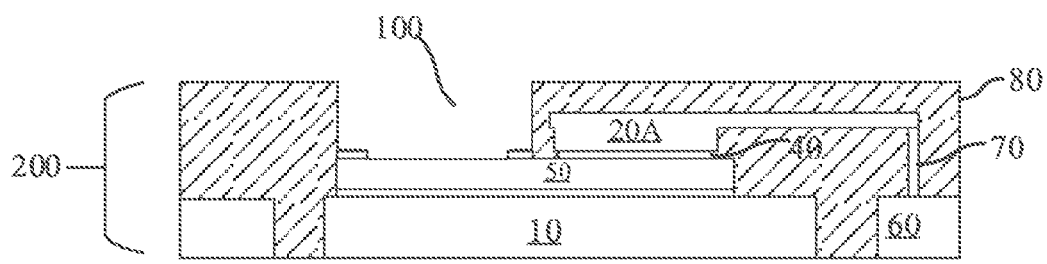
FIG. 11 illustrates a semiconductor package during fabrication after forming an opening in the encapsulant layer in accordance with an embodiment of the present invention.

FIG. 11 illustrates a semiconductor module during fabrication after forming an opening in the encapsulant layer in accordance with an embodiment of the present invention.

Referring next to FIG. 11, an opening 100 may be formed within the base semiconductor package 200. The opening 100 is intended to open contact areas on the die 50. For example, the opening 100 may open a redistribution metal over the die 50. Alternatively, the opening 100 may open an area of the first clip 20A. The opening 100 may be formed using an etching process in one embodiment. In another embodiment, the opening 100 may be formed using a laser process, e.g., a localized heating process. In various embodiments, the opening 100 may be formed using a combination of chemical, mechanical, plasma, and/or heating processes.

Figure 12:
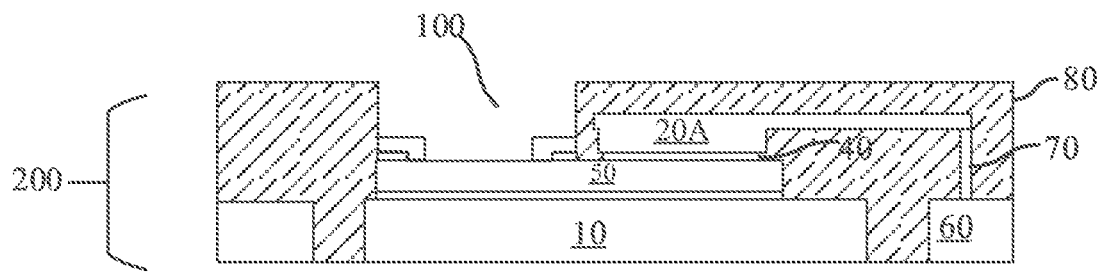
FIG. 12 illustrates a semiconductor package during fabrication after forming pads in the exposed opening in accordance with an embodiment of the present invention.

FIG. 12 illustrates a semiconductor module during fabrication after forming pads in the exposed opening in accordance with an embodiment of the present invention.

As next illustrated in FIG. 12, in one or more embodiments, a galvanic process may be performed to form larger contact areas over the die 50. In one embodiment, the contact pads of the die 50 may be exposed to the galvanic process. The galvanic process may grow a layer of copper over the exposed pads of the die 50 thereby forming galvanic pads 55.

For example, in one embodiment, the die 50 may comprise redistribution lines and/or under bump metallization, which may comprise multiple layers. For example, a stack may comprise a conductive liner, seed layer, and a thin conductive layer formed on top. The opening 100 may expose these redistribution lines and/or the under bump metallization pads in various embodiments.

In various embodiments, additional contact pads (galvanic pads 55) may be formed over these redistribution lines by an electroplating process. In various embodiments, a plating metal such as copper may be deposited. Although in some embodiments, other suitable conductors may be used. In further embodiments, the additional contact pads may be configured to form a good bond with the semiconductor component 150 being bonded to the base semiconductor package 200. In various embodiments, the galvanic pads 55 may comprise multiple layers, for example, Cu/Ni, Cu/Ni/Pd/Au, Cu/NiMoP/Pd/Au, or Cu/Sn, in one embodiment. The material of the galvanic pads 55 may be selected to form a solder (e.g., an eutectic solder) when combined with the contact material of the semiconductor component 150.

Figure 13:
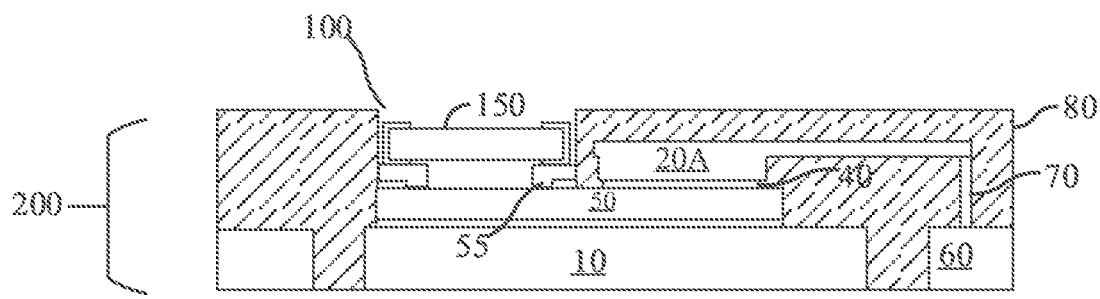
FIG. 13 illustrates a semiconductor package during fabrication after placing a semiconductor component over the opening in accordance with an embodiment of the present invention.

FIG. 13 illustrates a semiconductor module during fabrication after placing a semiconductor component over the opening in accordance with an embodiment of the present invention.

Referring next to FIG. 13, a semiconductor component 150 is positioned over the opening 100 in the base semiconductor package 200. The semiconductor component 150 may be attached to the galvanic pads 55. The attachment of the semiconductor component 150 may be performed using a nano conductive paste, a solder material in various embodiments. In one more embodiments, the component pad 140 on the semiconductor component 150 is bonded to the galvanic pads 55.

In one or more embodiments, the galvanic process may be used to tailor the redistribution leads. As one example, the redistribution leads may be widened to form a contact pad. In another example, new redistribution leads may be formed within the opening 100 in some embodiments.

In some embodiments, further processing may be stopped. However, in alternative embodiments, the semiconductor component 150 may be sealed within a second encapsulating material 180.

Figure 14:
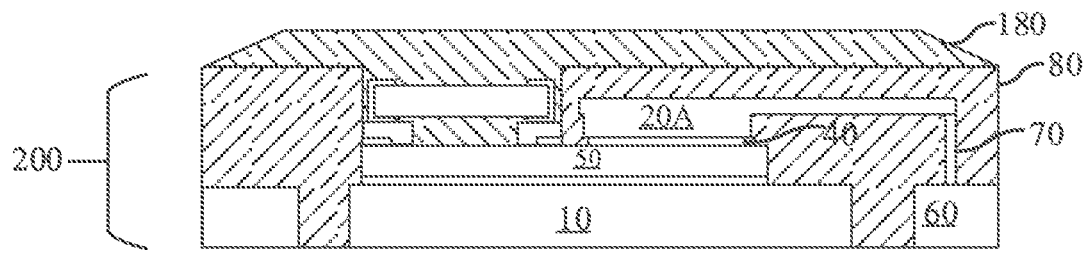
FIG. 14 illustrates a semiconductor module during fabrication having a second encapsulating material disposed over the first encapsulating material and filling the opening housing the semiconductor component in accordance with embodiments of the present invention.

FIG. 14 illustrates a semiconductor module during fabrication having a second encapsulating material disposed over the first encapsulating material and filling the opening housing the semiconductor component.

The second encapsulating material 180 may be coated over the major surface of the base semiconductor package 200. The second encapsulating material 180 may fill into the gap between the semiconductor component 150 and the sidewalls of the opening 100. In further embodiments, the second encapsulating material 180 may be a liquid that flows under the semiconductor component 150 to fill any gap between the semiconductor component 150 and the die 50.

In various embodiments, the second encapsulating material 180 is applied over the entire surface of the first encapsulating material 80 and cured. In one embodiment, the second encapsulating material 180 may be placed into a molding cavity, then the molding cavity is closed to compress the second encapsulating material 180. The final structure may be obtained after a curing process.

Figure 15:
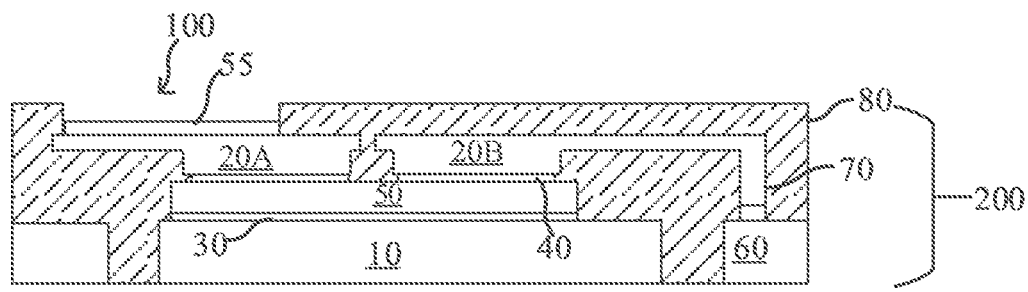
FIG. 15 illustrates a semiconductor module during fabrication after forming an opening over the first encapsulating material in accordance with alternative embodiments of the present invention.
Figure 16:
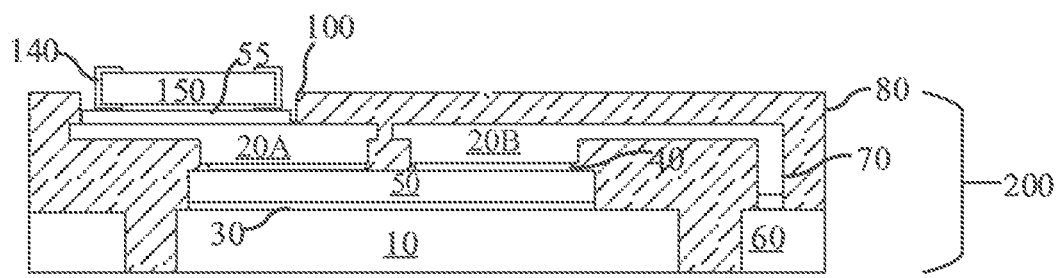
FIG. 16 illustrates a semiconductor module during fabrication after placing the semiconductor component over the opening in accordance with alternative embodiments of the present invention.
Figure 17:
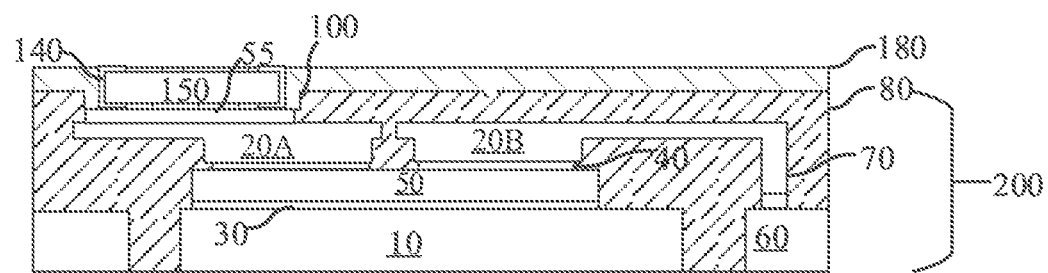
FIG. 17 illustrates a semiconductor module during fabrication after forming another encapsulant over the semiconductor component in accordance with alternative embodiments of the present invention.

FIGS. 15-17 illustrates a semiconductor module during various stages of fabrication in accordance with alternative embodiments of the present invention.

FIG. 15 illustrates a semiconductor module during fabrication after forming an opening over the first encapsulating material in accordance with alternative embodiments of the present invention.

In the embodiment illustrated in FIG. 15, the opening 100 exposes a portion of the clips such as the first clip 20A. A galvanic process may form an additional contact pad or a solder layer (illustrated as galvanic pads 55) over the exposed portion of the first clip 20A. For example, multi-layer stacks of Cu/Ni, Cu/Ni/Pd/Au, Cu/NiMoP/Pd/Au, or Cu/Sn, may be deposited over the first clip 20A in one or more embodiments.

FIG. 16 illustrates a semiconductor module during fabrication after placing the semiconductor component over the opening in accordance with alternative embodiments of the present invention. The semiconductor component 150 is placed over the opening 100 and bonded to the galvanic pads 55, for example, by the application of pressure and/or heating (FIG. 16).

FIG. 17 illustrates a semiconductor module after forming another encapsulant over the semiconductor component in accordance with alternative embodiments of the present invention.

As illustrated in FIG. 17, the semiconductor component 150 may be optionally sealed using a second encapsulating material 180 in some embodiments. Alternatively, in some embodiments, further processing may be avoided to minimize production costs.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-17 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor module, the method comprising:
providing a semiconductor package comprising a semiconductor die disposed in a first encapsulant;
forming an opening in the first encapsulant of the semiconductor package to expose a plurality of contact metallization of the semiconductor die;
forming contact pads over the plurality of contact metallization;
placing a semiconductor component within the opening; and
attaching the semiconductor component to the contact pads.

2. The method of claim 1, further comprising forming a second encapsulant over the semiconductor component.

3. The method of claim 1, wherein forming contact pads over the plurality of contact metallization comprises performing an electrochemical deposition process.

4. The method of claim 1, wherein attaching the semiconductor component to the contact pads comprises electrically coupling the semiconductor component using a bonding process.

5. The method of claim 1, further comprising applying a second encapsulant after attaching the semiconductor component to the contact pads.

6. The method of claim 1, wherein the semiconductor die comprises a power semiconductor die.

7. The method of claim 1, wherein the semiconductor component comprises a semiconductor die packaged within an encapsulant.

8. The method of claim 1, wherein the semiconductor component comprises a semiconductor die after wafer singulation.

9. A method of forming a semiconductor module, the method comprising:
providing a semiconductor package comprising:
a plurality of leads;
a first semiconductor die supported by a die paddle and disposed in a first encapsulant,
a clip coupling a region to a lead of the plurality of leads of the semiconductor package;
forming an opening in the first encapsulant of the semiconductor package to expose a portion of a top surface of the clip;
placing a semiconductor component within the opening; and attaching the semiconductor component to the exposed portion of the top surface of the clip.

10. The method of claim 9, further comprising forming a second encapsulant over the semiconductor component.

11. The method of claim 9, further comprising depositing a contact pad by performing an electrochemical deposition process after exposing the portion of the top surface of the clip.

12. The method of claim 9, further comprising applying a second encapsulant after attaching the semiconductor component.

13. The method of claim 9, wherein the semiconductor component comprises a semiconductor die packaged within an encapsulant.

14. The method of claim 9, wherein the semiconductor component comprises a semiconductor die after wafer singulation.

15. A method of forming a semiconductor module, the method comprising:
providing a first semiconductor package comprising a first semiconductor die disposed in a first encapsulant;
forming an opening in the first encapsulant; and
providing a second semiconductor package comprising a second semiconductor die disposed in a second encapsulant, wherein the second semiconductor package is disposed at least partially within the opening in the first encapsulant.

16. The method of claim 15, further comprising:
forming a third encapsulant over the second semiconductor package.

17. The method of claim 15, wherein the first and the second semiconductor dies comprise discrete power semiconductors.

18. The method of claim 15, wherein the first semiconductor package comprises a clip coupling a contact pad on the first semiconductor die to a lead, wherein the second semiconductor package comprises a contact pad coupled to a portion of the clip.

19. The method of claim 15, wherein the first semiconductor die comprises a contact pad, wherein the second semiconductor package comprises a contact pad coupled to the contact pad of the first semiconductor die.

20. The method of claim 15, further comprising:
forming a redistribution layer over the first semiconductor die; and
forming a contact pad on the redistribution layer, the second semiconductor package comprising a component pad coupled to the contact pad.

21. The method of claim 15, wherein the second semiconductor package comprises an inductor, a resistor, and/or a capacitor.

22. The method of claim 15, wherein the second semiconductor package comprises a discrete passive device.

23. A method of forming a semiconductor module, the method comprising:
providing a semiconductor package comprising a first semiconductor die disposed in a first encapsulant;
forming an opening in the first encapsulant; and
attaching a second semiconductor die at least partially within the opening in the first encapsulant.

24. The method of claim 23, wherein the second die comprises an inductor, a resistor, and/or a capacitor.

25. The method of claim 23, wherein the second die comprises a discrete passive device.

26. The method of claim 23, further comprising:
forming a second encapsulant over the second semiconductor die and the semiconductor package.

27. The method of claim 26, wherein the first and the second semiconductor dies comprise discrete power semiconductors.

28. The method of claim 26, wherein the second semiconductor die protrudes out of the opening.

29. The method of claim 26, wherein the second semiconductor die is disposed completely within the opening.

30. The method of claim 26, wherein the semiconductor package comprises a clip coupling a contact pad on the first semiconductor die to a lead, wherein the second semiconductor die comprises a contact pad coupled to a portion of the clip, and wherein the second semiconductor die is attached over the clip.

31. The method of claim 26, wherein the first semiconductor die comprises a first contact pad, wherein the second semiconductor die comprises a second contact pad attached to the first contact pad of the first semiconductor die.

* * * * *

UNITED STATES PATENT AND TRADEMARK OFFICE
CERTIFICATE OF CORRECTION

| | | |
|---|---|---|
| PATENT NO. | : 8,916,474 B2 | Page 1 of 1 |
| APPLICATION NO. | : 13/769769 | |
| DATED | : December 23, 2014 | |
| INVENTOR(S) | : Ralf Otremba | |

It is certified that error appears in the above-identified patent and that said Letters Patent is hereby corrected as shown below:

On the Title Page, item (72) Inventors, line 2, delete "H*glauer" and insert --Hoeglauer--.

Signed and Sealed this
Ninth Day of June, 2015

Michelle K. Lee
*Director of the United States Patent and Trademark Office*